US010745430B2

(12) United States Patent
Garratt et al.

(10) Patent No.: US 10,745,430 B2
(45) Date of Patent: Aug. 18, 2020

(54) MOLYBDENUM SILYLCYCLOPENTADIENYL AND SILYLALLYL COMPLEXES AND USE THEREOF IN THIN FILM DEPOSITION

(71) Applicant: Merck Patent GmbH, Darmstadt (DE)

(72) Inventors: Shaun Garratt, Bromborough (GB); Paul Williams, Bromborough (GB)

(73) Assignee: MERCK PATENT GMBH, Darmstadt (DE)

(*) Notice: Subject to any disclaimer, the term of this patent is extended or adjusted under 35 U.S.C. 154(b) by 0 days.

(21) Appl. No.: 15/124,783

(22) PCT Filed: Mar. 10, 2015

(86) PCT No.: PCT/US2015/019604
§ 371 (c)(1),
(2) Date: Sep. 9, 2016

(87) PCT Pub. No.: WO2015/138390
PCT Pub. Date: Sep. 17, 2015

(65) Prior Publication Data
US 2017/0121356 A1 May 4, 2017

Related U.S. Application Data

(60) Provisional application No. 61/952,633, filed on Mar. 13, 2014.

(51) Int. Cl.
*C23C 16/18* (2006.01)
*C07F 11/00* (2006.01)
(Continued)

(52) U.S. Cl.
CPC .............. *C07F 11/00* (2013.01); *C23C 16/18* (2013.01); *C23C 16/34* (2013.01); *C23C 16/405* (2013.01);
(Continued)

(58) Field of Classification Search
CPC ......... C23C 16/18; C23C 16/34; C23C 16/40; C07F 11/00
See application file for complete search history.

(56) References Cited

U.S. PATENT DOCUMENTS 4,851,249 A 7/1989 Hamano
5,352,488 A * 10/1994 Spencer .................. C23C 16/18
427/250

(Continued)

FOREIGN PATENT DOCUMENTS

CN 101781336 A 7/2010
TW 201022400 A 6/2010
(Continued)

OTHER PUBLICATIONS

Diskus, M., et al. (2011), "Growth of thin films of molybdenum oxide by atomic layer deposition", J. Mater. Chem., 21: 705-710.
(Continued)

*Primary Examiner* — Elizabeth A Burkhart
(74) *Attorney, Agent, or Firm* — Harness Dickey & Pierce P.L.C.

(57) ABSTRACT

Molybdenum complexes and use thereof in thin film deposition, such as CVD and ALD are provided herein. The molybdenum complexes correspond in structure to Formula (I): wherein $R^1$, $R^2$, $R^3$, $R^4$, $R^5$, $R^6$, $R^7$, $R^8$, $R^9$, and $R^{10}$ are
(Continued)

independently selected from the group consisting of hydrogen, alkyl, and trialkylsilyl; and at least one of $R^1$, $R^2$, $R^3$, $R^4$, $R^5$, $R^6$, $R^7$, $R^8$, $R^9$, and $R^{10}$ is trialkylsilyl.

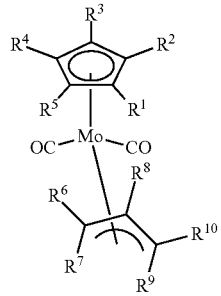

(I)

21 Claims, 3 Drawing Sheets (51) Int. Cl.
*C23C 16/455* (2006.01)
*C23C 16/34* (2006.01)
*C23C 16/40* (2006.01)
*H01L 21/02* (2006.01)
*H01L 45/00* (2006.01)

(52) U.S. Cl.
CPC .. *C23C 16/45536* (2013.01); *C23C 16/45553* (2013.01); *H01L 21/0228* (2013.01); *H01L 21/02175* (2013.01); *H01L 21/02205* (2013.01); *H01L 21/02274* (2013.01); *H01L 45/16* (2013.01)

(56) References Cited

U.S. PATENT DOCUMENTS

| | | | | |
|---|---|---|---|---|
| 6,491,978 | B1 * | 12/2002 | Kalyanam | C23C 16/18 257/E21.17 |
| 8,530,348 | B1 * | 9/2013 | Malhotra | H01L 29/92 438/612 |
| 9,028,917 | B2 | 5/2015 | Odedra et al. | |
| 9,802,220 | B2 | 10/2017 | Heys et al. | |
| 10,155,783 | B2 | 12/2018 | Kanjolia et al. | |
| 10,221,481 | B2 | 3/2019 | Kanjolia et al. | |
| 2009/0205538 | A1 | 8/2009 | Thompson et al. | |
| 2009/0209777 | A1 * | 8/2009 | Thompson | C07F 15/0053 556/136 |
| 2010/0261350 | A1 * | 10/2010 | Kanjolia | C07F 17/02 438/681 |
| 2011/0101327 | A1 | 5/2011 | Stoessel et al. | |
| 2013/0196065 | A1 | 8/2013 | Heys et al. | |
| 2014/0030436 | A1 * | 1/2014 | Knapp | C23C 16/18 427/255.28 |
| 2014/0370192 | A1 | 12/2014 | Odedra et al. | |
| 2016/0273160 | A1 | 9/2016 | Braymand et al. | |

FOREIGN PATENT DOCUMENTS

| | | |
|---|---|---|
| TW | 201219405 A | 5/2012 |
| TW | 201335415 A | 9/2013 |
| WO | WO-2009/094262 A1 | 7/2009 |
| WO | WO-2013/112383 A1 | 8/2013 |
| WO | WO 2014/018517 A1 | 1/2014 |

OTHER PUBLICATIONS

Ellefson, C., et al. (2012), "Synthesis and applications of molybdenum (IV) oxide", J Mater Sci, 47: 2057-2071.
George, S., et al. (1996), "Surface Chemistry for Atomic Layer Growth", J. Phys. Chem., 100: 13121-13131.
International Search Report and Written Opinion dated Jun. 9, 2015 issued in PCT/US2015/019604.
Miikkulainen, V., et al. (2007), "Atomic Layer Deposition of Molybdenum Nitride from Bis(tert-butylimido)-bis(dimethylamido)molybdenum and Ammonia onto Several Types of Substrate Materials with Equal Growth per Cycle", Chem. Mater., 19: 263-269.
Potter, R., et al. (2005), "Deposition of $HfO_2$, $Gd_2O_3$ and $PrO_x$ by Liquid Injection ALD Techniques", Chem. Vap. Deposition, 11(3): 159-169.
Braga S., et al., "Encapsulation of half-sandwich complexes of molybdenum with β-cyclodextrin," J. Chem. Soc., Dalton Trans., 17: 2964-2968 (2000).
Chow C., et al., "Intermolecular C—H Activations of Hydrocarbons Initiated by a Tungsten Trimethylsilylallyl Complex," Organometallics, 31(21): 7453-7466 (2012).
Honzicek J., et al., "Ring-Functionalized Molybdenocene Complexes," Organometallics, 28(9): 2871-2879 (2009).
Pannell K. H., et al., "Organometalloidal Derivatives of the Transition Metals III *. σ and π-Silylallyl Complexes," Journal of Organometallic Chemistry, 112(1): 37-48 (1976).
Yabe-Yoshida M., et al., "$\eta^3$-Silapropargyl/Alkynylsilyl Molybdenum Complexes: Synthesis, Structure, and Reactivity toward Methanol," J. Am. Chem. Soc., 131(26): 9138-9139 (2009).
Search Report issued in TW Patent Application No. 104108214, completed on Oct. 23, 2018.
Office Action dated Jul. 3, 2018 issued in Japanese Application No. 2016-575311 (with English translation), 7 pages.
Chinese Office Action dated Jul. 1, 2019 issued in Chinese Patent Application No. 201580024681.8 (with English translation), 4 pages.
English translation of Taiwanese Office Action dated Oct. 24, 2018 issued in Taiwanese Patent Application No. 104108214, 3 pages.
Korean Office Action dated Jul. 26, 2017 issued in Korean Patent Application No. 10-2016-7028173 (with English translation), 6 pages.
Korean Office Action dated Feb. 7, 2017 issued in Korean Patent Application No. 10-2016-7028173 (with English translation), 8 pages.
Israel Notification Prior to Examination dated Sep. 13, 2016 issued in Israel Patent Application No. 247719 (with English translation), 5 pages.
International Preliminary Report on Patentability dated Sep. 13, 2016 issued in PCT/US2015/019604, 6 pages.
European Office Action dated Jan. 25, 2017 issued in EP15716201.7, 3 pages.
Chinese Office Action dated Oct. 11, 2018 issued in Chinese Patent Application No. 201580024681.8 (with English translation), 33 pages.
Chinese Office Action dated May 22, 2018 issued in Chinese Patent Application No. 201580024681.8 (with English translation), 30 pages.

* cited by examiner

MOLYBDENUM SILYLCYCLOPENTADIENYL AND SILYLALLYL COMPLEXES AND USE THEREOF IN THIN FILM DEPOSITION

CROSS REFERENCE TO RELATED APPLICATIONS

This patent application is a U.S. national stage filing under 35 U.S.C. § 371 of International Application No. PCT/US2015/019604 filed on of 10 Mar. 2015, which claims the benefit of U.S. Provisional Patent Application Ser. No. 61/952,633 filed on 13 Mar. 2014. The entire disclosures each of the above recited applications are incorporated herein by reference.

FIELD OF THE INVENTION

The present invention relates to molybdenum (Mo) silylcyclopentadienyl and silylallyl complexes and methods of preparing thin films by chemical vapor deposition (CVD) or atomic layer deposition (ALD) using such complexes.

BACKGROUND OF THE INVENTION

Various organometallic precursors are used to form dielectric thin metal films. A variety of techniques have been used for the deposition of thin films. These include reactive sputtering, ion-assisted deposition, sol-gel deposition, CVD (also known as metalorganic CVD or MOCVD), and ALD (also known as atomic layer epitaxy). The CVD and ALD processes are being increasingly used as they have the advantages of good compositional control, high film uniformity, good control of doping, and, significantly, they give excellent conformal step coverage on highly non-planar microelectronics device geometries.

CVD is a chemical process whereby precursors are used to form a thin film on a substrate. In a typical CVD process, the precursors are passed over a substrate (e.g., wafer) in a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is also a method for the deposition of thin films. It is a self-limiting, sequential, unique film growth technique based on surface reactions that can provide precise thickness control and deposit conformal thin films of materials provided by precursors onto substrates of varying compositions. In ALD, the precursors are separated during the reaction. The first precursor is passed over the substrate producing a monolayer on the substrate. Any excess unreacted precursor is pumped out of the reaction chamber. A second precursor is then passed over the substrate and reacts with the first precursor, forming a second monolayer of film over the first-formed monolayer of film on the substrate surface. This cycle is repeated to create a film of desired thickness. ALD film growth is self-limiting and based on surface reactions, creating uniform depositions that can be controlled at the nanometer-thickness scale.

Thin films have a variety of important applications, such as nanotechnology and fabrication of semiconductor devices. Examples of such applications include conductive films, high-refractive index optical coatings, corrosion-protection coatings, photocatalytic self-cleaning glass coatings, biocompatible coatings, dielectric capacitor layers and gate dielectric insulating films in field-effect transistors (FET), capacitor electrodes, gate electrodes, adhesive diffusion barriers and integrated circuits. Thin films are also used in microelectronics applications, such as the high-κ dielectric oxide for dynamic random access memory (DRAM) applications and the ferroelectric perovskites used in infra-red detectors and non-volatile ferroelectric random access memories (NV-FeRAMs). The continual decrease in the size of microelectronics components has increased the need for the use of such dielectric thin films.

Furthermore, oxides and nitrides of molybdenum have numerous important applications. For example, molybdenum dioxide ($MoO_2$) displays unusual metal-like conductivity and can be applied in hydrocarbon oxidation catalysts, solid oxide fuel cell (SOFC) anodes, and high capacity reversible lithium ion battery (LIB) anodes. See, for example, Ellefson, C. A., et al. (2012) *J. Mater. Sci.*, 47:2057-2071. Another example, molybdenum trioxide ($MoO_3$) exhibits interesting electrochromic and catalytic properties and can be applied in nanostructured gas sensors and solid-state lithium ion batteries. See, for example, Diskus, M., et al. (2011) *J. Mater. Chem.*, 21:705-710. Also, thin films of transition metal nitrides have long been known to generally possess good mechanical and chemical stability. Films of molybdenum nitride (MoN and/or $MO_2N$) have been studied for applications including microelectronic diffusion barriers, high-temperature superconductors (high-$T_c$), and tribological and protective coatings. See, for example, Miikkulainen, V., et al. (2007) *Chem. Mater.*, 19:263-269.

WO 2013/112383 reports molybdenum allyl complexes and uses thereof in thin film deposition.

Many current molybdenum complexes for use in CVD and ALD do not provide the required performance to implement new processes for fabrication of next generation devices, such as semiconductors. More complexes with improved thermal stability, higher volatility, increased vapor pressures, and increased deposition rates are needed.

SUMMARY OF THE INVENTION

In one embodiment, an organometallic complex corresponding in structure to Formula I is provided:

Formula I wherein $R^1$, $R^2$, $R^3$, $R^4$, $R^5$, $R^6$, $R^7$, $R^8$, $R^9$, and $R^{10}$ are independently selected from the group consisting of hydrogen, alkyl, and trialkylsilyl; and at least one of $R^1$, $R^2$, $R^3$, $R^4$, $R^5$, $R^6$, $R^7$, $R^8$, $R^9$, and $R^{10}$ is trialkylsilyl.

Methods for forming molybdenum-containing films by vapor deposition processes, such as CVD and ALD, are provided herein using organometallic complexes corresponding in structure to Formula I.

Other embodiments, including particular aspects of the embodiments summarized above, will be evident from the detailed description that follows.

DETAILED DESCRIPTION OF THE INVENTION

In various aspects of the invention, Mo complexes, such as Mo (II) complexes, methods of making such complexes, and methods of using such complexes to form Mo, MoN, $Mo_2N$, MoN/$Mo_2N$, $MoO_2$, $MoO_3$, and $MoO_2$/$MoO_3$ films are provided.

In one embodiment, the methods of the invention can be used to create or grow Mo-containing thin films which display conductive properties.

I. DEFINITIONS

As used herein, the term "precursor" refers to an organometallic molecule, complex and/or compound which is passed over a substrate to form a thin film by a deposition process, for example, by CVD or ALD.

As used herein, the term "vapor deposition process" is used to refer to any type of vapor deposition technique such as CVD or ALD. In various embodiments of the invention, CVD may take the form of conventional (i.e., continuous flow) CVD, liquid injection CVD, or photo-assisted CVD. CVD may also take the form of a pulsed technique, i.e., pulsed CVD. In other embodiments, ALD may take the form of conventional (i.e., pulsed injection) ALD, liquid injection ALD, photo-assisted ALD, or plasma-assisted ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

The term "Cp" refers to a cyclopentadienyl ($C_5H_5$) ligand which is bound to molybdenum. As used herein, all five carbon atoms of the Cp ligand are bound to the metal center in $\eta^5$-coordination by π bonding, therefore the precursors of the invention are π complexes.

The term "allyl" refers to an allyl ($C_3H_5$) ligand which is bound to molybdenum. As used herein, the allyl ligand has a resonating double bond and all three carbon atoms of the allyl ligand are bound to the metal center in $\eta^3$-coordination by π bonding. Therefore, the complexes of the invention are π complexes. Both of these features are represented by the curved bond. When the allyl portion is substituted by one R group, $R^a$, the $R^a$ group replaces an allylic hydrogen to become [$R^aC_3H_4$]; when substituted with two R groups $R^a$ and $R^b$, it becomes [$R^aR^bC_3H_3$] where $R^a$ and $R^b$ are the same or different, and so forth. The π allyl complexes embrace all structural isomeric forms of an allyl group, including but not limited to endo and exo isomers.

The term "alkyl" refers to a saturated hydrocarbon chain of 1 to about 8 carbon atoms in length, such as, but not limited to, methyl, ethyl, propyl and butyl. The alkyl group may be straight-chain or branched-chain. "Alkyl" is intended to embrace all structural isomeric forms of an alkyl group. For example, as used herein, propyl encompasses both n-propyl and iso-propyl; butyl encompasses n-butyl, sec-butyl, iso-butyl and tert-butyl. Further, as used herein, "Me" refers to methyl, "Et" refers to ethyl, "Pr" refers to propyl, "i-Pr" refers to iso-propyl, "Bu" refers to butyl, "t-Bu" refers to tert-butyl, "s-Bu" refers to sec-butyl, "i-Bu" refers to iso-butyl, and "Np" refers to neo-pentyl. It should also be noted that $C_2$ is intended to refer to an ethyl group, and not dimethyl.

The term "alkenyl" refers to an unsaturated hydrocarbon chain of 2 to about 8 carbon atoms in length containing at least one carbon-to-carbon double bond. The alkenyl may be straight-chain or branched-chain. Non-limiting examples include ethylene, propylene, butylene, and pentenyl. "Alkenyl" is intended to embrace all structural isomeric forms of an alkene ligand including cis-trans form and E-Z form. For example, as used herein, 2-butenyl encompasses cis-2-butenyl, trans-2-butenyl, (E)-2-butenyl and (Z)-2-butenyl.

The term "alkoxy" refers to —O-alkyl containing from 1 to about 8 carbon atoms. The alkoxy may be straight-chain or branched-chain. Non-limiting examples include methoxy, ethoxy, propoxy, butoxy, isobutoxy, tert-butoxy, pentoxy, and hexoxy The term "alkynyl" refers to an unsaturated hydrocarbon chain of 2 to about 8 carbon atoms in length containing at least one carbon-to-carbon triple bond. The alkynyl may be straight-chain or branched-chain. Non-limiting examples include ethynyl, propynyl, 1-butynyl, 2-butynyl, 2-pentynyl, 3-methyl-1-pentynyl, 3-pentynyl, 1-hexynyl, 2-hexynyl, and 3-hexynyl.

The term "amino" herein refers to an optionally substituted monovalent nitrogen atom (i.e., —$NR^cR^d$, where $R^c$ and $R^d$ can be the same or different). Examples of amino groups encompassed by the invention include but are not limited to The term "aryl" refers to a monocyclic or polycyclic aromatic group, such as, but not limited to phenyl, naphthyl, thienyl and indolyl.

The term "aryloxy" refers to —O-aryl, such as, but not limited to phenoxy and napthoxy.

The term "silyl" refers to a —$SiZ^1Z^2Z^3$ radical, where each of $Z^1$, $Z^2$, and $Z^3$ is independently selected from the group consisting of hydrogen and optionally substituted alkyl, alkenyl, alkynyl, aryl, alkoxy, aryloxy, amino, and combinations thereof.

The term "trialkylsilyl" refers to a —$SiZ^1Z^2Z^3$ radical, wherein $Z^1$, $Z^2$, and $Z^3$ are alkyl, and wherein $Z^1$, $Z^2$, and $Z^3$ can be the same or different alkyls. Non-limiting examples of a trialkylsilyl include trimethylsilyl (TMS), triethylsilyl (TES), triisopropylsilyl (TIPS) and tert-butyldimethylsilyl (TBDMS).

Deposition of Mo metal, molybdenum nitrides such as MoN and $Mo_2N$ (or mixtures of such molybdenum nitrides), and molybdenum oxides such as $MoO_2$ and $MoO_3$ (or mixtures of such molybdenum oxides) is difficult to achieve due to stability issues, being either unstable or too stable for deposition. The organometallic complexes disclosed in the embodiments of the invention allow for control of physical properties as well as provide for increased stability and simple high yield synthesis.

II. ORGANOMETALLIC COMPLEXES

In a first embodiment, an organometallic precursor is provided corresponding in structure to Formula I:

Formula I wherein $R^1$, $R^2$, $R^3$, $R^4$, $R^5$, $R^6$, $R^7$, $R^8$, $R^9$, and $R^{10}$ are independently selected from the group consisting of hydrogen, alkyl, and trialkylsilyl; and at least one of $R^1$, $R^2$, $R^3$, $R^4$, $R^5$, $R^6$, $R^7$, $R^8$, $R^9$, and $R^{10}$ is trialkylsilyl. It is noted that no stereochemistry is implied or presented in the structure of Formula I, as described herein.

The structure of Formula I embraces all variations of stereochemistry. For example, in one embodiment, Formula I embraces the following structure of Formula A:

Formula A $R^1$, $R^2$, $R^3$, $R^4$ $R^5$, $R^6$, $R^7$, $R^8$, $R^9$ and $R^{10}$, at each occurrence, can be the same or different.

In one embodiment, up to and including nine of $R^1$, $R^2$, $R^3$, $R^4$, $R^5$, $R^6$, $R^7$, $R^8$, $R^9$, and $R^{10}$ are hydrogen.

In another embodiment, eight or nine of $R^1$, $R^2$, $R^3$, $R^4$, $R^5$, $R^6$, $R^7$, $R^8$, $R^9$, and $R^{10}$ are hydrogen.

In another embodiment, at least one of $R^1$, $R^2$, $R^3$, $R^4$ and $R^5$ is hydrogen. In a further embodiment, at least two of $R^1$, $R^2$, $R^3$, $R^4$ and $R^5$ are hydrogen. In a further embodiment, at least three of $R^1$, $R^2$, $R^3$, $R^4$ and $R^5$ are hydrogen. In a further embodiment, at least four of $R^1$, $R^2$, $R^3$, $R^4$ and $R^5$ are hydrogen. In a further embodiment, $R^1$, $R^2$, $R^3$, $R^4$ and $R^5$ are hydrogen. In a further embodiment, $R^2$, $R^3$, $R^4$ and $R^5$ are hydrogen.

In another embodiment, at least one of $R^6$, $R^7$, $R^8$, $R^9$ and $R^{10}$ are hydrogen. In a further embodiment, at least two of $R^6$, $R^7$, $R^8$, $R^9$ and $R^{10}$ are hydrogen. In a further embodiment, at least three of $R^6$, $R^7$, $R^8$, $R^9$ and $R^{10}$ are hydrogen. In a further embodiment, at least four of $R^6$, $R^7$, $R^8$, $R^9$ and $R^{10}$ are hydrogen. In a further embodiment, $R^6$, $R^7$, $R^8$, $R^9$ and $R^{10}$ are hydrogen. In a further embodiment, $R^6$, $R^7$, $R^9$ and $R^{10}$ are hydrogen. In a further embodiment, $R^6$, $R^7$, $R^8$ and $R^9$ are hydrogen.

In another embodiment, up to and including nine of $R^1$, $R^2$, $R^3$, $R^4$, $R^5$, $R^6$, $R^7$, $R^8$, $R^9$, and $R^{10}$ are independently at each occurrence alkyl.

In another embodiment, at least one of $R^6$, $R^7$, $R^8$, $R^9$ and $R^{10}$ is alkyl. In a further embodiment, at least two of $R^6$, $R^7$, $R^8$, $R^9$ and $R^{10}$ are alkyl. In a further embodiment, at least three of $R^6$, $R^7$, $R^8$, $R^9$ and $R^{10}$ are alkyl. In a further embodiment, at least four of $R^6$, $R^7$, $R^8$, $R^9$ and $R^{10}$ are alkyl. In a further embodiment, $R^6$, $R^7$, $R^8$, $R^9$ and $R^{10}$ are an alkyl. In a further embodiment, $R^8$ is alkyl.

The alkyl groups discussed herein can be $C_1$-$C_8$-alkyl, $C_1$-$C_7$-alkyl, $C_1$-$C_6$-alkyl, $C_1$-$C_5$-alkyl, $C_1$-$C_4$-alkyl, $C_1$-$C_3$-alkyl, $C_1$-$C_2$-alkyl or $C_1$-alkyl. In a further embodiment, the alkyl is $C_1$-$C_4$-alkyl. In a further embodiment the alkyl is selected from the group consisting of methyl, ethyl, propyl, isopropyl, butyl, isobutyl, sec-butyl, and tert-butyl.

In another embodiment, one or two of $R^1$, $R^2$, $R^3$, $R^4$, $R^5$, $R^6$, $R^7$, $R^8$, $R^9$, and $R^{10}$ is trialkylsilyl.

In another embodiment, two of $R^1$, $R^2$, $R^3$, $R^4$, $R^5$, $R^6$, $R^7$, $R^8$, $R^9$, and $R^{10}$ are trialkylsilyl.

In another embodiment, more than two of $R^1$, $R^2$, $R^3$, $R^4$, $R^5$, $R^6$, $R^7$, $R^8$, $R^9$, and $R^{10}$ are trialkylsilyl.

In another embodiment, one of $R^1$, $R^2$, $R^3$, $R^4$, and $R^5$ is trialkylsilyl and one of $R^6$, $R^7$, $R^8$, $R^9$, and $R^{10}$ is trialkylsilyl.

In another embodiment, $R^1$ is trialkylsilyl.
In another embodiment, $R^{10}$ is trialkylsilyl.
In another embodiment, $R^1$ and $R^{10}$ are trialkylsilyl.
In another embodiment, two of $R^1$, $R^2$, $R^3$, $R^4$, and $R^5$ are trialkylsilyl.

The trialkylsilyl groups discussed herein can be tri($C_1$-$C_8$-alkyl)silyl, tri($C_1$-$C_7$-alkyl)silyl, tri($C_1$-$C_6$-alkyl)silyl, tri($C_1$-$C_5$-alkyl)silyl, tri($C_1$-$C_4$-alkyl)silyl, tri($C_1$-$C_3$-alkyl)silyl, tri($C_1$-$C_2$-alkyl)silyl or tri($C_1$-alkyl)silyl. In a further embodiment, the trialkylsilyl is tri($C_1$-$C_4$-alkyl)silyl. Again, each alkyl group in the trialkylsilyl can be the same or different. In a further embodiment, the trialkylsilyl is selected from the group consisting of trimethylsilyl, triethylsilyl, triisopropylsilyl, and tert-butyldimethylsilyl.

In another embodiment, one or two of $R^1$, $R^2$, $R^3$, $R^4$, $R^5$, $R^6$, $R^7$, $R^8$, $R^9$, and $R^{10}$ is trimethylsilyl.

In another embodiment, $R^1$, $R^2$, $R^3$, $R^4$, $R^5$, $R^6$, $R^7$, $R^8$, $R^9$, and $R^{10}$ are independently selected from the group consisting of hydrogen, $C_1$-$C_8$-alkyl, and tri($C_1$-$C_8$-alkyl)silyl.

In another embodiment, $R^1$, $R^2$, $R^3$, $R^4$, $R^5$, $R^6$, $R^7$, $R^8$, $R^9$, and $R^{10}$ are independently selected from the group consisting of hydrogen, $C_1$-$C_4$-alkyl, and tri($C_1$-$C_4$-alkyl)silyl.

In another embodiment, $R^1$, $R^2$, $R^3$, $R^4$, $R^5$, $R^6$, $R^7$, $R^8$, $R^9$, and $R^{10}$ are independently selected from the group consisting of hydrogen, methyl, ethyl, propyl, isopropyl, butyl, isobutyl, sec-butyl, tert-butyl, trimethylsilyl, triethylsilyl, triisopropylsilyl, and tert-butyldimethylsilyl.

In another embodiment, $R^1$ is trimethylsilyl and $R^2$, $R^3$, $R^4$, and $R^5$ are hydrogen.

In another embodiment, $R^1$ is trimethylsilyl; $R^2$, $R^3$, $R^4$, and $R^5$ are hydrogen; and four or five of $R^6$, $R^7$, $R^8$, $R^9$, and $R^{10}$ are hydrogen.

In another embodiment, $R^1$ is trimethylsilyl; $R^2$, $R^3$, $R^4$, $R^5$, $R^6$, $R^7$, $R^9$, and $R^{10}$ are hydrogen; and $R^8$ is selected from the group consisting of hydrogen, methyl, ethyl, propyl, isopropyl, butyl, isobutyl, sec-butyl, tert-butyl, and trimethylsilyl.

In another embodiment, $R^1$ is trimethylsilyl; $R^2$, $R^3$, $R^4$, $R^5$, $R^6$, $R^7$, $R^8$, and $R^9$ are hydrogen; and $R^{10}$ is selected from the group consisting of hydrogen, methyl, ethyl, propyl, isopropyl, butyl, isobutyl, sec-butyl, tert-butyl, and trimethylsilyl.

In one embodiment, $R^1$, $R^2$, $R^3$, $R^4$, $R^5$, $R^6$, $R^7$, $R^8$, $R^9$, and $R^{10}$ are independently selected from the group consisting of hydrogen, alkyl, and trialkylsilyl; and at least one of $R^1$, $R^2$, $R^3$, $R^4$, $R^5$, $R^6$, $R^7$, $R^8$, $R^9$, and $R^{10}$ is trialkylsilyl; wherein, when at least one of $R^1$, $R^2$, $R^3$, $R^4$, and $R^5$ is trialkylsilyl, then at least one of $R^6$, $R^7$, $R^8$, $R^9$, and $R^{10}$ is alkyl or trialkylsilyl; and when $R^1$, $R^2$, $R^3$, $R^4$, and $R^5$ are each hydrogen, then at least one of $R^6$, $R^7$, $R^8$, $R^9$, and $R^{10}$ which is not trialkylsilyl is alkyl.

In another embodiment, $R^1$ is trimethylsilyl; $R^2$, $R^3$, $R^4$, and $R^5$ are hydrogen; and four of $R^6$, $R^7$, $R^8$, $R^9$, and $R^{10}$ are hydrogen.

In another embodiment, $R^1$ is trimethylsilyl; $R^2$, $R^3$, $R^4$, $R^5$, $R^6$, $R^7$, $R^9$, and $R^{10}$ are hydrogen; and $R^8$ is selected from the group consisting of methyl, ethyl, propyl, isopropyl, butyl, isobutyl, sec-butyl, tert-butyl, and trimethylsilyl.

In another embodiment, $R^1$ is trimethylsilyl; $R^2$, $R^3$, $R^4$, $R^5$, $R^6$, $R^7$, $R^8$, and $R^9$ are hydrogen; and $R^{10}$ is selected from the group consisting of methyl, ethyl, propyl, isopropyl, butyl, isobutyl, sec-butyl, tert-butyl, and trimethylsilyl.

In one embodiment, $R^1$, $R^2$, $R^3$, $R^4$, $R^5$, $R^6$, $R^7$, $R^8$, $R^9$, and $R^{10}$ are independently selected from the group consisting of hydrogen, alkyl, and trialkylsilyl; and at least one of $R^1$, $R^2$, $R^3$, $R^4$, $R^5$, $R^6$, $R^7$, $R^8$, $R^9$, and $R^{10}$ is trialkylsilyl; wherein, when $R^1$ is trimethylsilyl and $R^2$, $R^3$, $R^4$, and $R^5$ are each hydrogen, then $R^6$, $R^7$, $R^8$, $R^9$, and $R^{10}$ are not each hydrogen; when $R^1$ and $R^3$ are each trimethylsilyl and $R^2$, $R^4$, and $R^5$ are each hydrogen, then $R^6$, $R^7$, $R^8$, $R^9$, and $R^{10}$ are not each hydrogen; when $R^8$ is trimethylsilyl and $R^6$, $R^7$, $R^9$ and $R^{10}$ are each hydrogen, then $R^1$, $R^2$, $R^3$, $R^4$, and $R^5$ are not each hydrogen; when $R^{10}$ is trimethylsilyl and $R^6$, $R^7$, $R^8$, and $R^9$ are each hydrogen, then $R^1$, $R^2$, $R^3$, $R^4$, and $R^5$ are not each hydrogen.

Examples of organometallic complexes corresponding in structure to Formula I are shown in Table 1.

TABLE 1

Complexes of Formula I (1)

TABLE 1-continued

Complexes of Formula I (2)

(3)

(4)

(4)

(5)

(6)

(7)

TABLE 1-continued

Complexes of Formula I

(8)

(9)

(10)

(11)

(12)

(13)

(14)

(15)

In one embodiment, a mixture of two or more organometallic complexes of Formula I is provided. For example, a mixture of two or more organometallic complexes from Table 1 is provided, such as, but not limited to mixtures of: complexes 1 and 2; complexes 1 and 3; complexes 1 and 4; complexes 2 and 3; complexes 2 and 4; complexes 3 and 4; complexes 1, 2 and 3; complexes 1, 2 and 4; complexes 1, 3 and 4, complexes 2, 3 and 4; and complexes 1, 2, 3 and 4.

III. METHODS

In another embodiment, methods of forming a molybdenum-containing film by a vapor deposition process are provided. The methods comprise vaporizing at least one organometallic complex corresponding in structure to Formula I as disclosed herein. For example, this may include vaporizing the at least one complex and delivering the at least one complex to a substrate surface or passing the at least one complex over a substrate and/or decomposing the at least one complex on the substrate surface.

In a particular embodiment, the organometallic complexes may be dissolved in an appropriate hydrocarbon or amine solvent. Appropriate hydrocarbon solvents include, but are not limited to aliphatic hydrocarbons, such as hexane, heptane, and nonane; aromatic hydrocarbons, such as toluene and xylene; aliphatic and cyclic ethers, such as diglyme, triglyme, and tetraglyme. Examples of appropriate amine solvents include, without limitation, octylamine and N,N-dimethyldodecylamine. For example, the organometallic complex may be dissolved in toluene to yield a solution with a concentration of about 0.05 M to about 1M.

In another embodiment, at least one complex corresponding in structure to Formula I may be delivered "neat" (undiluted by a carrier gas) to a substrate.

In one embodiment, the vapor deposition process is chemical vapor deposition.

In another embodiment, the vapor deposition process is atomic layer deposition.

The ALD and CVD methods of the invention encompass various types of ALD and CVD processes such as, but not limited to, continuous or pulsed injection processes, liquid injection processes, photo-assisted processes, and plasma-assisted processes. For purposes of clarity, the methods of the present invention specifically include direct liquid injection processes. For example, in direct liquid injection CVD ("DLI-CVD"), a solid or liquid complex may be dissolved in a suitable solvent and the solution formed therefrom injected into a vaporization chamber as a means to vaporize the complex. The vaporized complex is then transported/delivered to the substrate. In general, DLI-CVD may be particularly useful in those instances where a complex displays relatively low volatility or is otherwise difficult to vaporize.

In one embodiment, conventional or pulsed injection CVD is used to form a metal-containing thin film by vaporizing and/or passing at least one complex according to Formula I as disclosed herein over a substrate. For conventional and pulsed CVD processes, see for example Smith, Donald (1995). *Thin-Film Deposition: Principles and Practice*. McGraw-Hill.

In one embodiment, CVD growth conditions for complexes according to Formula I include, but are not limited to:
(1) Substrate temperature: 50-600° C.
(2) Evaporator temperature (Mo Source Temp): 0-200° C.
(3) Reactor pressure: 0-100 Torr
(4) Argon or Nitrogen carrier gas flow rate: 0-500 sccm (5) Oxygen flow rate: 0-500 sccm
(6) Hydrogen flow rate: 0-500 sccm
(7) Run time: will vary according to desired film thickness In another embodiment, photo-assisted CVD is used to form a molybdenum containing thin film by vaporizing and/or passing at least one complex according to Formula I as disclosed herein over a substrate.

In a further embodiment, conventional (i.e., pulsed injection) ALD is used to form a molybdenum containing thin film by vaporizing and/or passing at least one complex according to Formula I as disclosed herein over a substrate. For conventional ALD processes see, for example, George S. M., et al., *J. Phys. Chem.,* 1996, 100, 13121-13131.

In another embodiment, liquid injection ALD is used to form a molybdenum containing thin film by vaporizing and/or passing at least one complex according to Formula I as disclosed herein over a substrate, wherein at least one liquid complex is delivered to the reaction chamber by direct liquid injection as opposed to vapor draw by a bubbler. For liquid injection ALD process see, for example, Potter R. J., et al., *Chem. Vap. Deposition,* 2005, 11(3), 159-169.

Examples of ALD growth conditions for complexes according to Formula I include, but are not limited to:
(1) Substrate temperature: 0-400° C.
(2) Evaporator temperature (Mo Source Temp): 0-200° C.
(3) Reactor pressure: 0-100 Torr
(4) Argon or Nitrogen carrier gas flow rate: 0-500 sccm
(5) Reactive gas flow rate: 0-500 sccm
(6) Pulse sequence (sec.) (complex/purge/reactive gas/purge): will vary according to chamber size
(7) Number of cycles: will vary according to desired film thickness In another embodiment, photo-assisted ALD is used to form a molybdenum-containing thin film by vaporizing and/or passing at least one complex according to Formula I as disclosed herein over a substrate. For photo-assisted ALD processes see, for example, U.S. Pat. No. 4,581,249.

In another embodiment, plasma-enhanced ALD is used to form molybdenum-containing thin films by vaporizing and/or passing at least one complex according to Formula I as disclosed herein over a substrate.

Thus, the organometallic complexes according to Formula I disclosed herein utilized in these methods may be liquid, solid, or gaseous. Typically, the organometallic complexes are liquid or a low-melting solid at ambient temperatures with a vapor pressure sufficient to allow for consistent transport of the vapor to the process chamber.

In one embodiment, the organometallic complex according to Formula I is a solid with a melting point less than or equal to about 50° C., less than or equal to about 45° C., less than or equal to about 40° C., less than or equal to about 35° C., or less than or equal to about 30° C.

In one embodiment, the organometallic complexes corresponding to Formula I as disclosed herein are delivered to a substrate in pulses alternating with pulses of an oxygen source, such as a reactive oxygen species. Examples of such oxygen source include, without limitation, $H_2O$, $H_2O_2$, $O_2$, ozone, air, i-PrOH, t-BuOH or $N_2O$.

In one embodiment, a Mo, molybdenum nitride (e.g., MoN, $Mo_2N$, or MoN/$Mo_2N$), and/or a molybdenum oxide (e.g., $MoO_2$, $MoO_3$, or $MoO_2$/$MoO_3$) film can be formed by delivering for deposition at least one complex according to Formula I, independently or in combination with a co-reactant. The co-reactant may be deposited or delivered or passed over a substrate, independently or in combination with the at least one complex. Examples of such co-reactants include, but are not limited to hydrogen, hydrogen plasma, oxygen, air, water, $H_2O_2$, ammonia, a hydrazine, a borane, a silane, such as a trisilane, ozone or any combination thereof. Examples of suitable boranes include, without limitation, hydridic (i.e. reducing) boranes such as borane, diborane, triborane and the like. Examples of suitable silanes include, without limitation, hydridic silanes such as silane, disilane, trisilane, and the like. Examples of suitable hydrazines include, without limitation, hydrazine ($N_2H_4$) and/or a hydrazine optionally substituted with one or more alkyl groups (i.e., an alkyl-substituted hydrazine) such as methylhydrazine, tert-butylhydrazine, N,N- or N,N'-dimethylhydrazine, and the like.

In a particular embodiment, a co-reactant is used to form a $MoO_2$, $MoO_3$, or $MoO_2$/$MoO_3$ film by delivering for deposition at least one complex according to Formula I, independently or in combination, with a co-reactant such as, but not limited to air, $H_2O$, $O_2$, and/or ozone to a reaction chamber. A plurality of such co-reactants may be used.

In another particular embodiment, a co-reactant is used to form a MoN, $Mo_2N$, or MoN/$Mo_2N$ film by delivering for deposition at least one complex according to Formula I, independently or in combination, with a co-reactant such as, but not limited to ammonia, a hydrazine, or other nitrogen-containing compound, such as but not limited to an amine, to a reaction chamber. A plurality of such co-reactants may be used.

In another particular embodiment, a co-reactant is used to form a molybdenum-containing metal film by delivering for deposition at least one complex according to Formula I, independently or in combination, with a co-reactant such as, but not limited to $H_2$, a hydrazine, a silane such as trisilane and/or ammonia to a reaction chamber.

In another embodiment, a mixed-metal film can be formed by a vapor deposition process which vaporizes a complex of Formula I disclosed herein in combination, but not necessarily at the same time, with a co-complex having a metal different from molybdenum.

A variety of substrates can be used in the methods of the present invention. For example, the complexes according to Formula I as disclosed herein may be delivered or passed over a variety of substrates such as, but not limited to, silicon such as Si(100), silicon oxide, silicon nitride, tantalum, tantalum nitride, copper, ruthenium, titanium nitride, tungsten, and tungsten nitride.

In particular embodiment, the methods of the invention are utilized for applications such as dynamic random access memory (DRAM) and complementary metal oxide semiconductor (CMOS) for memory and logic applications, on substrates such as silicon chips.

Any of the molybdenum complexes described herein may be used to prepare thin films of molybdenum metal, molybdenum oxides, and/or molybdenum nitrides. Such films may find application as oxidation catalysts, anode materials (e.g., SOFC or LIB anodes), conducting layers, sensors, diffusion barriers/coatings, super- and non-super conducting materials/coatings, tribological coatings, and/or protective coatings. It is understood by one of ordinary skill in the art that film properties (e.g., conductivity) depend on a number of factors, such as the metal(s) used for deposition, the presence or absence of co-reactants and/or co-complexes, the thickness of the film created, the parameters and substrate employed during growth and subsequent processing.

Fundamental differences exist between the thermally-driven CVD process and the reactivity-driven ALD process. The requirements for precursor properties to achieve optimum performance vary greatly. In CVD a clean thermal decomposition of the precursor to deposit the required species onto the substrate is critical. However, in ALD such a thermal decomposition is to be avoided at all costs. In ALD, the reaction between the input reagents must be rapid at the surface resulting in formation of the target material on the substrate. However, in CVD, any such reaction between species is detrimental due to their gas phase mixing before reaching the substrate, which could lead to particle formation. In general it is accepted that good CVD precursors do not necessarily make good ALD precursors due to the relaxed thermal stability requirement for CVD precursors. The Formula I molybdenum precursors described herein possess enough thermal stability and reactivity toward select co-reactants to function as ALD precursors, and they possess clean decomposition pathways at higher temperatures to form desired materials through CVD processes as well. Therefore, molybdenum complexes described by Formula I are useful as viable ALD and CVD precursors. Without being bound by theory, it is believed that the disordered nature of the trialkylsilyl group improves volatility, compared to equivalent sized alkyl groups and increases the likelihood of forming a liquid complex, which is most desirable for deposition processes.

EXAMPLES

The following examples are merely illustrative, and do not limit this disclosure in any way.

Unless otherwise noted, all manipulations were performed under an inert atmosphere (e.g, purified nitrogen or argon) using techniques for handling air-sensitive materials commonly known in the art (e.g., "Schlenk techniques").

Example 1: Preparation of Trimethylsilylcyclopentadienyl Molybdenum Dicarbonyl 2-Methylallyl (Me$_3$SiCpMo(CO)$_2$(2-Me-allyl)

A 5 L 3 neck round bottom flask equipped with magnetic stirrer and condenser was charged with Mo(CO)$_6$ (150 g, 0.568 mol) followed by anhydrous acetonitrile (2 L). The mixture was refluxed at 90° C. for 16-24 hours under a nitrogen atmosphere resulting in a yellow colored solution. The reaction continued until no more CO gas evolution was observed in an external oil bubbler. The solution was allowed to cool to room temperature (RT), and then 1.5 mol equiv. 3-chloro-2-methyl-1-propene (76.8 g, 83 ml, 0.85 mol) was added slowly by syringe to the stirred solution. During the addition, an orange color was formed and CO evolution was observed. The mixture was stirred overnight at 60° C. After about 15-20 minutes, a yellow/orange solid began to crystallize out of the solution. On the next day, the mixture is allowed to cool to RT and then allowed to settle out for several hours to ensure the product crystallizes as much as possible. The resulting yellow precipitate was cannula filtered, then washed with acetonitrile (200 ml).

After drying in vacuo, Mo(CO)$_2$(MeCN)$_2$(2-Me-allyl)Cl was obtained as a yellow powder, yielding about 155 g (84%).

A 1 L round bottom flask was charged with sodium hydride (NaH) (11.5 g, 0.48 mol) in a glove box. Anhydrous tetrahydrofuran (THF) (500 ml) was added and the suspension was stirred vigorously at 30° C. A dropping funnel was attached under nitrogen purge, which was then charged with trimethylsilylcyclopentadiene (Me$_3$SiCpH) (66.3 g, 0.48 mol). The Me$_3$SiCpH was then added slowly to the stirred NaH suspension. Initiation of the reaction in some instances occurred after about 15-20% of the material was added, but then hydrogen evolution was observed at a steady rate. Once all the Me$_3$SiCpH was added, the reaction was continued until no further hydrogen evolution was observed, wherein a clear pale yellow/orange solution (Na[Me$_3$SiCp]) was formed.

In a 5 L round bottom flask, Mo(CO)$_2$(MeCN)$_2$(2-Me-allyl)Cl (155 g, 0.477 mol) was charged and anhydrous THF (1.5 L) was added resulting in an orange solution to which the solution of Na[Me$_3$SiCp] was added slowly via a cannula over about 1 hour. The resulting dark red solution was stirred overnight at RT, wherein a pale precipitate of NaCl formed. The solvent was removed under reduced pressure, and then the residue was extracted with hexane (2×1 L). The resulting yellow/brown colored solution was filtered by cannula and then the solvent was removed under reduced pressure, wherein a yellow/brown oil was obtained. The crude material was distilled at 130° C./0.5 Torr, wherein a yellow/orange liquid/low melting solid was obtained (melting point 30° C.).

Yield of Me$_3$SiCpMo(CO)$_2$(2-Me-allyl)=about 100 g (51% from Mo(CO)$_6$).

$^1$H NMR (C$_6$D$_6$): δ 0.20 (s, 9H, SiMe$_3$), 1.72 (m, 5H, allyl-Me, allyl-H), 2.63 (s, 2H, allyl-H), 2.62 (s, 2H, allyl-H), 4.74 (s, 4H, Cp-H).

Figure 1:
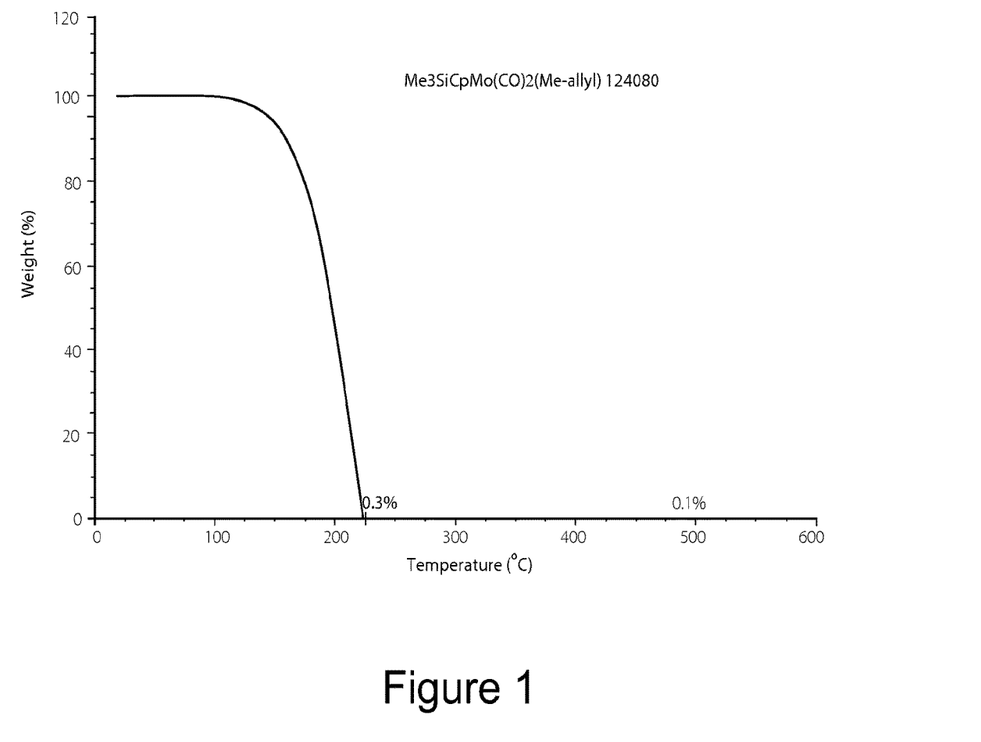
FIG. 1 is a graphical representation of thermal gravimetric analysis (TGA) data demonstrating % weight loss vs. temperature of $Me_3SiCpMo(CO)_2$(2-Me-allyl).

FIG. 1 shows a TGA plot of Me$_3$SiCpMo(CO)$_2$(2-Me-allyl).

Example 2: Preparation of Trimethylsilylcyclopentadienyl Molybdenum Dicarbonyl 2-tert-Butylallyl (Me$_3$SiCpMo(CO)$_2$(2-tBu-allyl)

A 5 L 3 neck round bottom flask equipped with overhead stirrer and condenser was charged with Mo(CO)$_6$ (50 g, 0.189 mol) followed by anhydrous acetonitrile (0.7 L). The mixture was refluxed at 90° C. for 16-24 hours under a nitrogen atmosphere resulting in a yellow colored solution. The reaction continued until no more CO gas evolution was observed in an external oil bubbler. The solution was allowed to cool to room temperature (RT), and then 2-bromomethyl-3,3-dimethylbutene (34.0 g, 0.19 mol) was added slowly by syringe to the stirred solution. During addition, an orange/red color was formed and CO evolution was observed. The mixture was stirred overnight at 60° C. or until no more CO evolution was observed. No precipitate was obtained from this reaction. Once completed, the mixture was allowed to cool and then the solvent was removed under reduced pressure resulting in an orange/brown solid. The orange/brown solid was dried under vacuum, yielding $Mo(CO)_2(MeCN)_2$(2-tBu-allyl)Br at about 73 g (96%).

A 1 L round bottom flask was charged with sodium hydride (NaH) (4.4 g, 0.183 mol) in a glove box. Anhydrous THF (200 ml) was added and the suspension was stirred vigorously at 30° C. A dropping funnel was attached under nitrogen purge, which was then charged with trimethylsilylcyclopentadiene ($Me_3SiCpH$) (25.3 g, 0.183 mol). The $Me_3SiCpH$ was then added slowly to the stirred NaH suspension. Initiation of the reaction in some instances occurred after about 15-20% of the material was added, but then hydrogen evolution was observed at a steady rate. Once all the $Me_3SiCpH$ was added, the reaction was continued until no further hydrogen evolution was observed, wherein a clear pale yellow/orange solution was formed. The resulting solution was then slowly added by cannula to a solution of $Mo(CO)_2(MeCN)_2$(2-tBu-allyl)Br (73 g, 0178 mol) in anhydrous THF (0.5 L). The resulting dark red solution was stirred overnight at RT, wherein a pale precipitate of NaCl was formed. The solvent was removed in vacuo, and then the residue was extracted with hexane (2×0.5 L). The resulting dark red colored mixture was filtered by cannula and then evaporated resulting in a dark red liquid

The mixture was distilled at 0.5 Torr. Small quantities of white molybdenum carbonyl based impurities sublimed out at 60-90° C., at which point an orange liquid distilled out.

Yield of $Me_3SiCpMo(CO)_2$(2-tBu-allyl) (orange solid, melting point 44-45° C.)=about 35 g (50%).

$^1$H NMR ($C_6D_6$): δ 0.19 (s, 9H, $Me_3Si$), 1.12 (s, 9H, tBu), 1.53 (s, 2H, allyl-H), 1.70 (s, 3H, allyl-Me), 2.83 (s, 2H, allyl-H), 4.64 (m, 2H, Cp-H), 4.69 (m, 2H, Cp-H).

Figure 2:
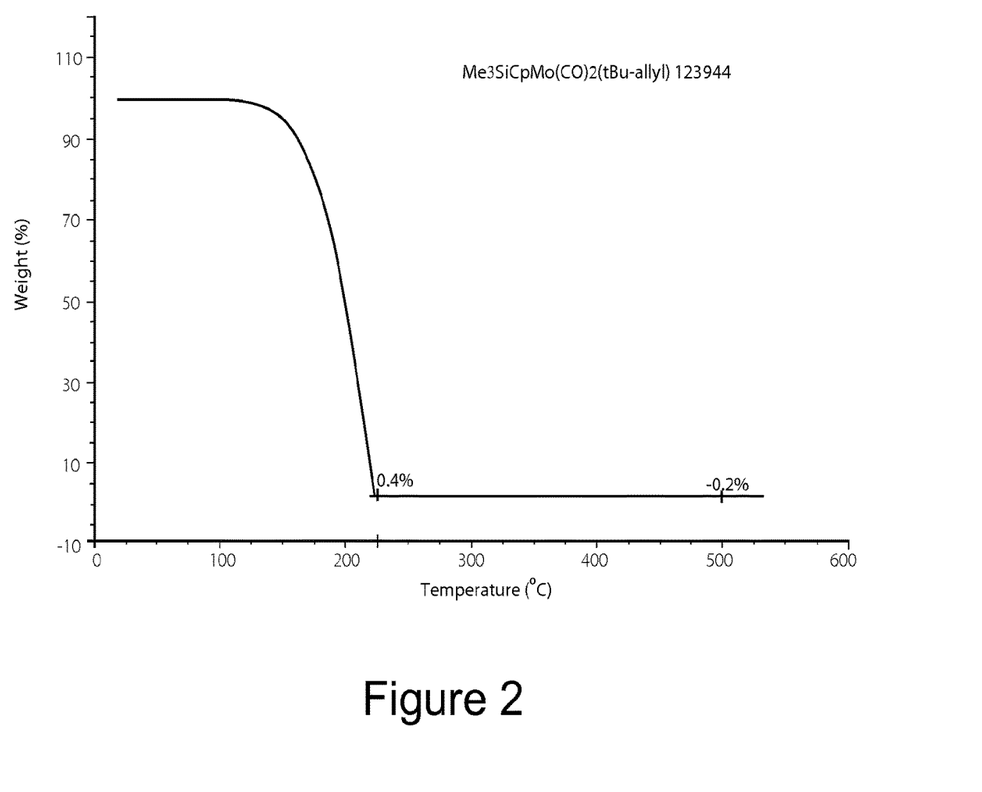
FIG. 2 is a graphical representation of TGA data demonstrating % weight loss vs. temperature of $Me_3SiCpMo(CO)_2$(2-tBu-allyl).

FIG. 2 shows a TGA plot of $Me_3SiCpMo(CO)_2$(2-tBu-allyl).

Example 3: Preparation of Trimethylsilylcyclopentadienyl Molybdenum Dicarbonyl 1-Trimethylsilylally ($Me_3SiCpMo(CO)_2$(1-$Me_3Si$-allyl)

A 5 L 3 neck round bottom flask equipped with magnetic stirrer and condenser was charged with $Mo(CO)_6$ (60 g, 0.227 mol) followed by anhydrous acetonitrile (0.8 L). The mixture was refluxed at 90° C. for 16 hours under a nitrogen atmosphere resulting in a yellow colored solution. The reaction continued until no more CO gas evolution was observed in an external oil bubbler. The solution was allowed to cool to room temperature (RT), and then 2(1-bromo-2-propen-1-yl)trimethylsilane (44.0 g, 0.19 mol) was added slowly by syringe to the stirred solution. During the addition, an orange/red color was formed and CO evolution was observed. The mixture was stirred overnight at 60° C., at which point no more CO evolution was observed. The mixture was allowed to cool and then the solvent was removed under reduced pressure. The resulting orange/brown solid was dried under vacuum, yielding $Mo(CO)_2(MeCN)_2$(1-$Me_3Si$-allyl)Br at 96 g (97%).

A 1 L round bottom flask was charged with sodium hydride (NaH) (5.5 g, 0.227 mol) in a glove box. Anhydrous THF (300 ml) was added and the suspension was stirred vigorously at 30° C. A dropping funnel was attached under nitrogen purge, which was then charged with trimethylsilylcyclopentadiene ($Me_3SiCpH$) (31.4 g, 0.227 mol). The $Me_3SiCpH$ was then added slowly to the stirred NaH suspension where hydrogen evolution was observed at a steady rate. Once all the $Me_3SiCpH$ was added, the reaction was continued until no further hydrogen evolution was observed, wherein a clear pale yellow/orange solution was formed.

The resulting solution was added slowly by cannula to a solution of $Mo(CO)_2(MeCN)_2$(1-$Me_3Si$-allyl)Br (96 g, 0.277 mol) in anhydrous (THF) (0.6 L). The resulting dark red solution was stirred overnight at RT, wherein a pale precipitate of NaCl formed. The solvent was removed under reduced pressure, and then the residue was extracted with hexane (2×0.5 L). The dark red colored mixture was filtered by cannula and then evaporated resulting in a dark red liquid. The product was distilled at 130° C./0.5 Torr.

Yield of $Me_3SiCpMo(CO)_2$(1-$Me_3Si$-allyl) (red/orange solid, melting point 45° C.)=58.5 g (60% from $Mo(CO)_6$).

$^1$H NMR ($C_6D_6$): δ 0.12 (s, 9H, $Me_3Si$), 0.25 (s, 9H, $Me_3Si$), 0.87 (d, 1H, allyl-H), 0.97 (d, 1H, allyl-H), 2.57 (d, 1H, allyl-H), 3.61 (m, 1H, allyl-H), 4.53 (s, 1H, Cp-H), 4.81 (s, 1H, Cp-H), 4.90 (s, 1H, Cp-H), 5.04 (s, 1H, Cp-H).

Figure 3:
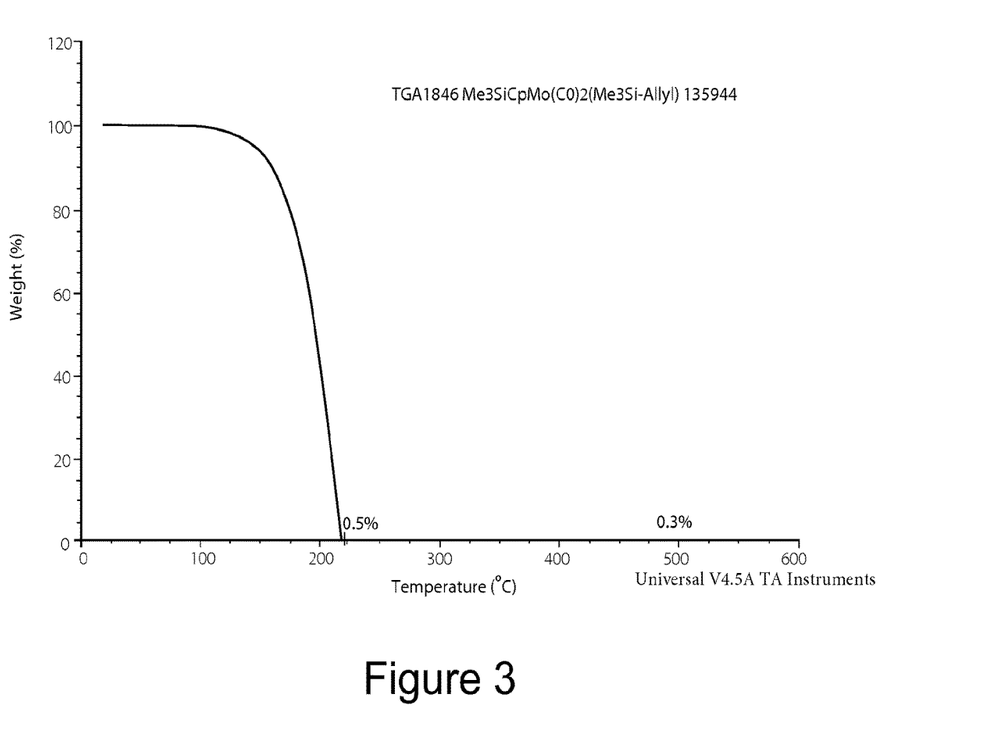
FIG. 3 is a graphical representation of TGA data demonstrating % weight loss vs. temperature of $Me_3SiCpMo(CO)_2$(1-$Me_3$Si-allyl).

FIG. 3 shows a TGA plot of $Me_3SiCpMo(CO)_2$(1-$Me_3Si$-allyl).

Example 4: Deposition of Molybdenum Oxide by Atomic Layer Deposition with Compounds of Formula I, Using Ozone as Co-Reactant In all experiments, the Mo source is kept at 90° C. with a nitrogen carrier gas flow of 80 sccms during the experiments. The ozone co-reactant concentration is 260 g/Nm3, at a flow rate of 60 sccms and is pulsed for 1.0 s. In all experiments, the baseline reactor pressure is between 1.2 and 1.5 Torr. The substrates used are 10 nm $SiO_2$ on Si ($SiO_2$ 1 K) and hydrogen terminated Si(100) (Si(H-term)). Typical conditions are shown below:

Substrate temperature: 200° C.
Co-reactant: Ozone
Nitrogen purge time: 5.0 s
Pulse train: 1.0 s Mo precursor/5.0 s $N_2$ purge/1.0 s ozone/5.0 s $N_2$ purge
Total cycles: 1000

XPS spectra and cross sectional SEM micrographs for films deposited on Si are analyzed. As a measure of uniformity, film thicknesses are measured by cross sectional SEM at many different points on the substrate.

Example 5: ALD Using ($Me_3SiCpMo(CO)_2$(2-Me-Allyl) for in a $MoO_3$ Film ($Me_3SiCpMo(CO)_2$(2-Me-allyl) was heated to ~90° C. in a stainless steel bubbler, delivered into an ALD reactor using nitrogen as a carrier gas, and pulsed for ~5 seconds followed by a ~10 second purge at ~250° C. to ~350° C. Ozone ($O_3$) was used as the oxidant and was pulsed for ~10 seconds and purged for ~15 seconds during each cycle. The substrates used were silicon chips having ~1 kÅ thermal $SiO_2$ and thin native oxide layers, respectively. The ALD conditions are shown below:

Substrate temperature: ~250° C.
Co-reactant: Ozone
$N_2$ carrier gas flow rate: ~10 sccm each for ($Me_3SiCpMo(CO)_2$(2-Me-allyl)) and ozone
Base pressure: ~0.53-0.55 Torr
Ozone pulse peak pressure: ~2.5-2.6 Torr
Ozone concentration: ~186-200 g/$Nm^3$
Pulse train: ~5.0 s ($Me_3SiCpMo(CO)_2$(2-Me-allyl)/~10.0 s $N_2$ purge/~10.0 s ozone/~15.0 s $N_2$ purge
Total cycles: 200

Formation of a $MoO_3$ film on the substrates was visually confirmed.

All patents and publications cited herein are incorporated by reference into this application in their entirety and for all purposes as if fully set forth herein.

The words "comprise", "comprises", and "comprising" are to be interpreted inclusively rather than exclusively.

What is claimed is:

1. An organometallic complex corresponding in structure to Formula I:

Formula I wherein
$R^1$ is selected from the group consisting of trimethylsilyl, triethylsilyl, and tert-butyldimethylsilyl;
$R^2$, $R^3$, $R^4$, and $R^5$ are hydrogen;
$R^6$, $R^7$, $R^8$, $R^9$, and $R^{10}$ are independently selected from the group consisting of hydrogen, $C_1$-$C_8$-alkyl, and tri($C_1$-$C_8$-alkyl)silyl; and
at least one of $R^6$, $R^7$, $R^8$, $R^9$, and $R^{10}$ is selected from the group consisting of trimethylsilyl, triethylsilyl, and tert-butyldimethylsilyl.

2. The organometallic complex of claim 1, wherein $R^6$, $R^7$, $R^8$, $R^9$, and $R^{10}$ are independently selected from the group consisting of hydrogen, methyl, ethyl, propyl, isopropyl, butyl, isobutyl, sec-butyl, tert-butyl, trimethylsilyl, triethylsilyl, triisopropylsilyl, and tert-butyldimethylsilyl.

3. The organometallic complex of claim 1, wherein $R^1$ is trimethylsilyl.

4. The organometallic complex of claim 1, wherein $R^1$ is trimethylsilyl;
$R^6$, $R^7$, $R^9$, and $R^{10}$ are hydrogen; and
$R^8$ is selected from the group consisting of triethylsilyl, tert-butyldimethylsilyl, and trimethylsilyl.

5. The organometallic complex of claim 1, wherein
$R^1$ is trimethylsilyl;
$R^6$, $R^7$, $R^8$, and $R^9$ are hydrogen; and
$R^{10}$ is selected from the group consisting of triethylsilyl, tert-butyldimethylsilyl, and trimethylsilyl.

6. The organometallic complex of claim 5, wherein the complex is

7. A method for forming a molybdenum-containing film by a vapor deposition process, the method comprising vaporizing an organometallic complex corresponding in structure to Formula I:

Formula I wherein
$R^1$ is selected from the group consisting of trimethylsilyl, triethylsilyl, and tert-butyldimethylsilyl;
$R^2$, $R^3$, $R^4$, and $R^5$ are hydrogen;
$R^6$, $R^7$, $R^8$, $R^9$, and $R^{10}$ are independently selected from the group consisting of hydrogen, $C_1$-$C_8$-alkyl, and tri($C_1$-$C_8$-alkyl)silyl; and
at least one of $R^6$, $R^7$, $R^8$, $R^9$, and $R^{10}$ is selected from the group consisting of trimethylsilyl, triethylsilyl, and tert-butyldimethylsilyl.

8. The method of claim 7, wherein $R^6$, $R^7$, $R^8$, $R^9$, and $R^{10}$ are independently selected from the group consisting of hydrogen, methyl, ethyl, propyl, isopropyl, butyl, isobutyl, sec-butyl, tert-butyl, trimethylsilyl, triethylsilyl, triisopropylsilyl, and tert-butyldimethylsilyl.

9. The method of claim 7, wherein $R^1$ is trimethylsilyl.

10. The method of claim 7, wherein
$R^1$ is trimethylsilyl;
$R^6$, $R^7$, $R^9$, and $R^{10}$ are hydrogen; and
$R^8$ is selected from the group consisting of triethylsilyl, tert-butyldimethylsilyl, and trimethylsilyl.

11. The method of claim 7, wherein
$R^1$ is trimethylsilyl;
$R^6$, $R^7$, $R^8$, and $R^9$ are hydrogen; and
$R^{10}$ is selected from the group consisting of triethylsilyl, tert-butyldimethylsilyl, and trimethylsilyl.

12. The method of claim 11, wherein the complex is

13. The method of claim 7, wherein the vapor deposition process is chemical vapor deposition.

14. The method of claim 13, wherein the chemical vapor deposition is pulsed chemical vapor deposition, continuous flow chemical vapor deposition, or liquid injection chemical vapor deposition.

15. The method of claim 7, wherein the vapor deposition process is atomic layer deposition.

16. The method of claim 15, wherein the atomic layer deposition is liquid injection atomic layer deposition or plasma-enhanced atomic layer deposition.

17. The method of claim 7, wherein the at least one organometallic complex is delivered to a substrate in pulses alternating with pulses of an oxygen source to form a metal oxide film, wherein the oxygen source is selected from the group consisting of $H_2O$, air, $O_2$, and ozone.

18. The method of claim 7, further comprising vaporizing at least one co-organometallic complex to form a metal oxide film.

19. The method of claim 18, further comprising vaporizing at least one co-reactant selected from the group consisting of hydrogen, hydrogen plasma, oxygen, air, water, ammonia, a hydrazine, a borane, a silane, ozone and a combination of any two or more thereof.

20. The method of claim 19, further comprising vaporizing a hydrazine as a co-reactant, wherein the hydrazine is hydrazine ($N_2H_4$) or N,N-dimethylhydrazine.

21. The method of claim 7, wherein the method is used for a DRAM or CMOS application.

* * * * *